(12) United States Patent
Downes

(10) Patent No.: US 6,386,435 B1
(45) Date of Patent: May 14, 2002

(54) SYSTEMS AND METHODS FOR DISTRIBUTING SOLDER PASTE USING A TOOL HAVING A SOLDER PASTE APERTURE WITH A NON-CIRCULAR CROSS-SECTIONAL SHAPE

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 18 days.

(21) Appl. No.: 09/636,360

(22) Filed: Aug. 11, 2000

(51) Int. Cl.$^7$ .............................................. B23K 31/02
(52) U.S. Cl. ................... 228/248.1; 228/180.22
(58) Field of Search ............................. 228/248.1–254, 228/44.7, 49.5, 180.22; 438/613–617; 257/737, 738

(56) References Cited

U.S. PATENT DOCUMENTS

| | | | |
|---|---|---|---|
| 4,134,339 A | * 1/1979 | Iten | |
| 5,107,759 A | 4/1992 | Omori et al. | ................ 101/114 |
| 5,484,963 A | * 1/1996 | Washino | |
| 5,593,080 A | * 1/1997 | Teshima et al. | |
| 5,704,287 A | 1/1998 | Omori et al. | ................ 101/127 |
| 5,812,378 A | * 9/1998 | Fjelstad et al. | |
| 5,861,670 A | * 1/1999 | Akasaki | |
| 6,025,258 A | * 2/2000 | Ochiai et al. | |
| 6,090,301 A | * 7/2000 | Mizukoshi et al. | |
| 6,131,511 A | * 10/2000 | Wachi et al. | |
| 6,135,024 A | * 10/2000 | Higashida et al. | |

* cited by examiner

Primary Examiner—Tom Dunn
Assistant Examiner—Jonathan Johnson
(74) Attorney, Agent, or Firm—Chapin & Huang, L.L.C.; David E. Huang

(57) ABSTRACT

The invention is directed to techniques for distributing solder paste using a tool that defines a solder paste aperture having a non-circular cross-sectional shape. When the non-circular shape coincides with a pad and at least a portion of a stringer leading to the pad during a solder paste distribution process, solder paste is deposited over the pad and the stringer portion. Since solder paste now resides on the stringer portion, solder is not drawn from the pad toward the stringer portion during the soldering process as with some conventional situations. Rather, solder within the solder paste that resides on the stringer portion tends to adhere to the stringer portion, while some of the solder volume over the stringer pulls back to join the solder over the pad due to surface tension of the solder. The end result is a robust solder joint between the pad and corresponding component contact. Furthermore, the non-circular shape of the aperture allows for apertures that are larger in size than apertures for stencils that do not implement conventional overprinting approaches thus reducing the likelihood of clogging. One arrangement of the invention is directed to a solder paste distribution system having a base, a tool holder coupled to the base, and a solder paste distribution tool coupled to the tool holder. The solder paste distribution tool includes a support member that couples to the tool holder, a distribution member that defines a solder paste aperture having a non-circular cross-sectional shape, and a fastener that secures the distribution member to the support member.

13 Claims, 9 Drawing Sheets

SYSTEMS AND METHODS FOR DISTRIBUTING SOLDER PASTE USING A TOOL HAVING A SOLDER PASTE APERTURE WITH A NON-CIRCULAR CROSS-SECTIONAL SHAPE

BACKGROUND OF THE INVENTION

Some circuit boards include component mounting locations formed by circuit board pads or contacts. On such a circuit board, the circuit board pads typically connect to vias (plated through holes) through stringers, which are portions of metallic etch on the surface of the circuit board. A typical stringer is approximately 0.007 of an inch ("7 mils") wide and can be between 0.000 to 0.007 inches in length.

Mounting a circuit board component (i.e., an integrated circuit or IC, a small circuit board portion, etc.) to a circuit board mounting location typically involves soldering contacts of the component (e.g., leads, balls, pins, pads, etc.) to the circuit board pads. Some soldering approaches involve placing a small portion of solder paste on the top of each circuit board pad prior to soldering the component contacts to the circuit board pads. One such approach involves applying solder paste through a stencil that defines multiple solder paste apertures having circular cross-sectional shapes. This approach deposits small portions of solder paste on the circuit board pads through the solder paste apertures. The solder paste portions melt during the soldering process in order to form solder joints between the contacts of a circuit board component and the circuit board pads.

In general, the aperture placement mirrors the placement of the circuit board pads within the circuit board mounting location such that the portions of solder paste are deposited precisely on the circuit board pads. Additionally, diameters of the circular apertures are at least as large as those of the pads in order to fully cover each circuit board pad with solder paste.

The solder paste generally includes non-solder elements (e.g., flux, binders, etc.) which dissipate during the soldering process (e.g., vaporizes, separates from the solder and subsequently washes away, etc.) thus reducing the volume of material forming solder joints. To compensate for this volume reduction, some circuit board manufactures implement a technique known as "overprinting" which involves the use of stencils having apertures with diameters that are slightly larger than the diameters of the circuit board pads. Such stencils deposit portions of solder paste that are slightly wider than the circuit board pads with the expectation that, as the portions shrink during the soldering process, (i) the solder not covering the pads will pull back over the pads due to surface tension, and (ii) adequate amounts of solder will be left between the contacts of the component and the circuit board pads in order to form reliable solder joints.

There are some footprint designs (i.e., layouts of pads, vias, stringers and other connecting etches on the surface of the circuit board) that maximize particular circuit board structure dimensions (e.g., pad areas, drill sizes for vias, etc.) in an attempt to maximize circuit board reliability. When these more robust footprint features are repeated within a mounting location (e.g., side-by-side), the direct radial clearance (DRC) between adjacent features can be very small (e.g., 6.8 to 7.0 mils). Accordingly, overprinting on such footprints can be difficult or impossible to implement without substantially increasing the likelihood of forming solder shorts between footprint features intended to be electrically isolated (i.e., across DRC points of tangency).

SUMMARY OF THE INVENTION

Unfortunately, there are deficiencies to the above-described conventional soldering approaches. In particular, such approaches often suffer from unintended solder migration during the soldering process. For example, on some circuit boards, the solder mask (i.e., a protective laminate coating provided by circuit board manufacturers to cover conductive and non-conductive surfaces of the circuit board which are not intended for soldering) may be positioned such that a portion of a stringer is left uncovered by the solder mask (e.g., due to minor inaccuracies in aligning the solder mask with the circuit board but which are within tolerance). This exposed stringer portion can wet and draw solder from the portion of solder paste placed on the adjoining pad. Accordingly, the solder can migrate away from the pad, and along the stringer toward a via that connects to the other end of the stringer. In some situations (e.g., a short stringer, a porous solder mask, etc.), the solder can migrate almost completely from the pad and into the via cavity. The end result is often a poor solder joint between the pad and the corresponding component contact which provides an intermittent electrical connection, or in some cases a bad solder joint that provides no electrical connection.

In some situations, overprinting tends to promote solder migration since overprinting provides larger amounts of solder paste. As such, during the soldering process, an exposed stringer leading from a circuit board pad to a via may draw solder away from its intended location between the circuit board pad and a component contact, and toward an unintended location that causes a short (e.g., a pad-to-pad short, a via-to-via short, etc.).

Weak solder joints, bad solder joints and shorts lower manufacturing yields and are typically costly to debug and repair. By way of example, a ball grid array (BGA) component, which has an array of contacts (e.g., balls) that solder to a corresponding array of circuit board pads, typically limits visual access to the solder joints between the BGA component and the circuit board. Accordingly, visual detection of a poor solder joint or a solder short underneath the BGA component typically involves scanning (e.g., X-raying) the hidden solder joints using sophisticated scanning equipment, an expensive and time consuming process.

Furthermore, for stencils used on circuit board mounting locations having small pitches (e.g., stencils having aperture diameters of less than 1.27 mm) and that are not oversized to provide overprinting, the apertures have a tendency to clog with solder paste over time. Moreover, solder paste has a usable life after which it becomes unusable and a clogging contaminant (e.g., a skin forms over the paste, solvents evaporate, etc.). Such clogging leads to subsequent depositing of inadequate amounts of solder paste on the circuit board pads resulting in the formation of poor solder joints and low manufacturing yields.

In contrast to the above-described conventional soldering approaches which use a stencil having apertures with circular cross-sections to apply portions of solder paste over circuit board pads, the invention is directed to techniques for distributing solder paste using a tool that defines a solder paste aperture having a non-circular cross-sectional shape. When the non-circular shape coincides with a circuit board pad and at least a portion of a stringer leading to the pad, solder paste is distributed over the pad and the stringer portion through the solder paste aperture. Since the solder paste now resides on the stringer portion, solder is not drawn from the pad toward the stringer portion during the soldering process. Rather, solder that resides on the stringer portion tends to adhere to the stringer portion, while some of the solder volume over the stringer pulls back to join the solder over the pad due to surface tension of the solder. The end result is a robust solder joint between the pad and corresponding component contact. Furthermore, the non-circular shape of the aperture allows for apertures that are larger in size than apertures for stencils that do not implement conventional overprinting approaches thus reducing the likelihood of clogging.

One arrangement of the invention is directed to a solder paste distribution system having a base, a tool holder coupled to the base, and a solder paste distribution tool coupled to the tool holder. The solder paste distribution tool includes a support member that couples to the tool holder, a distribution member that defines a solder paste aperture having a non-circular cross-sectional shape, and a fastener that secures the distribution member to the support member.

In one arrangement, the solder paste aperture resembles a keyhole. This keyhole-shaped aperture preferably increases solder paste volume over a pad and a portion of an adjoining stringer. Accordingly, the solder paste, which is "overprinted" beyond the pad, is in an area that does not affect the direct radial clearance (DRC) values between adjacent circuit board footprint features (e.g., clearances to an adjacent pad or via). As a result, this arrangement is particularly suitable for footprint designs in which conventional overprinting is difficult or impossible such as a design that maximizes particular circuit board structure dimensions (e.g., pad areas, drill sizes for vias, etc.) in an attempt to maximize circuit board reliability. Tight DRC's between adjacent pads and vias (e.g., 6.8 to 7.0 mils) can be left unaffected since solder paste distributed beyond the pads is distributed only over adjoining stringers (and perhaps slightly over solder mask near the adjoining stringers). As such, this technique enables formation of robust solder joints without substantially increasing the likelihood of forming solder shorts between footprint features intended to be electrically isolated.

In one arrangement, the non-circular cross-sectional shape of the solder paste aperture includes partially coinciding circles having different diameters. Preferably, the partially coinciding circles include a first circle having a first diameter, and a second circle having a second diameter that is less than the first diameter. The second circle is disposed relative to the first circle such that when the first circle aligns over a soldering pad of a circuit board, at least a portion of the second circle aligns over at least a portion of a stringer leading to the soldering pad. Accordingly, when the circuit board is properly oriented such that the non-circular cross-sectional shaped aperture aligns with the pad and the portion of the stringer leading to the pad, a small portion of solder paste can be deposited through the aperture onto the pad and the portion of the stringer.

In one arrangement, the distribution member of the solder paste distribution tool defines multiple solder paste apertures which include the solder paste aperture having the non-circular cross-sectional shape. Accordingly, the apertures can apply solder paste to multiple areas simultaneously.

In one arrangement, the cross-sectional shape of each of the multiple solder paste apertures includes a first circle having a first diameter and a second circle having a second diameter that is different than the first diameter. The second circle partially coincides with the first circle. For each of the multiple solder paste apertures, the second circle of that solder paste aperture resides in a same direction relative to the first circle of that solder paste aperture. This arrangement is suitable for use when the stringers extend from their respective pads in the same direction.

In another arrangement, for a first solder paste aperture, the second circle of the first solder paste aperture resides in a first direction relative to the first circle of the first solder paste aperture and, for a second solder paste aperture, the second circle of the second solder paste aperture resides in a second direction relative to the first circle of the second solder paste aperture, the second direction being different than the first direction. This arrangement is suitable for use when the stringers extend from their respective pads in different directions.

Another arrangement of the invention is directed to a method for making a solder paste distribution tool. The method involves (a) providing a support member, (b) providing a distribution member that includes a solder paste aperture having a non-circular cross-sectional shape, and (c) fastening the distribution member to the support member. In one arrangement, the step of providing the distribution member involves drilling partially coinciding circles through a solid substrate in order to form the distribution member that includes the solder paste aperture having the non-circular cross-sectional shape. After the solder paste distribution tool is made, the tool can be used to distribute solder paste on a mounting location of a circuit board. In particular, the solder paste can be distributed using the tool such that a portion of solder in the solder paste resides over a portion of a stringer leading to a circuit board pad. During the soldering process, this solder can adhere to the stringer, while the majority of the solder volume over the stringer pulls back to join solder over the pad in order to form a robust solder joint. The non-circular shape of the aperture allows for apertures that are larger in size than apertures for stencils that do not implement overprinting thus reducing the likelihood of solder paste clogging within the solder paste distribution tool.

The features of the invention, as described above, may be employed in solder paste distribution systems (e.g., component mounting systems) and methods such as those manufactured by EMC Corporation of Hopkinton, Massachusetts.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for distributing solder paste using a tool that defines a solder paste aperture having a non-circular cross-sectional shape. When the non-circular shape coincides with a pad and at least a portion of a stringer leading to the pad during a solder paste distribution process, solder paste is deposited over the pad and the stringer portion. Since solder paste now resides on the stringer portion, solder is not drawn from the pad toward the stringer portion during the soldering process as in some conventional soldering approaches. Rather, solder within the solder paste that resides on the stringer portion tends to adhere to the stringer portion, while some of the solder volume over the stringer pulls back to join the solder over the pad due to surface tension of the solder. The end result is a robust solder joint between the pad and corresponding component contact. Additionally, the non-circular shape of the aperture allows for apertures that are larger in size than apertures for stencils that do not implement conventional overprinting approaches thus reducing the likelihood of clogging. The techniques of the invention may be used in systems and methods for mounting circuit board components such as used by EMC Corporation of Hopkinton, Mass.

Figure 1:
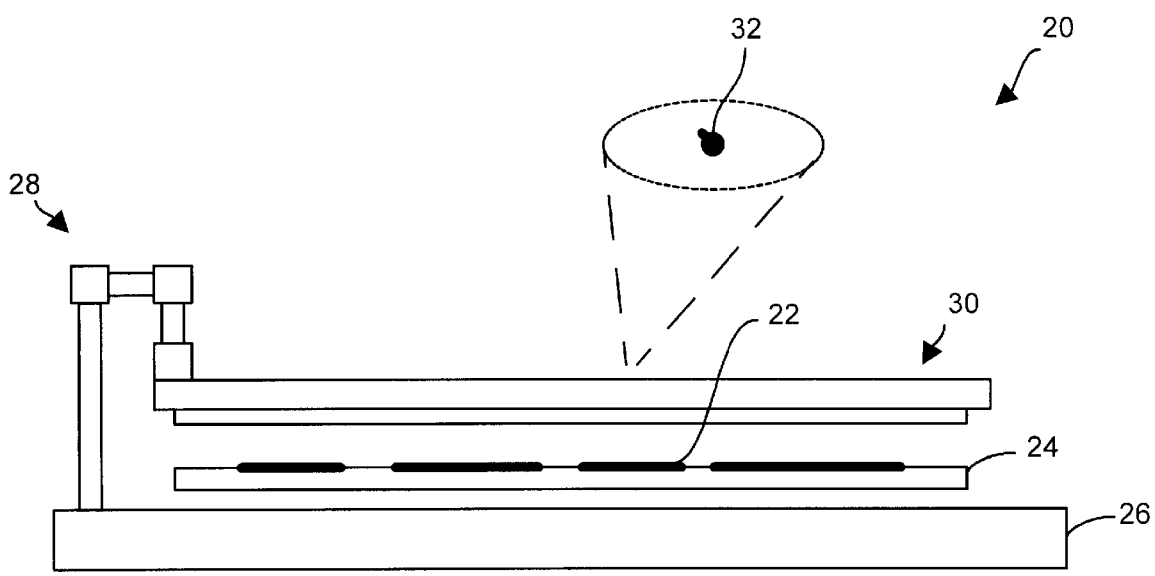
FIG. 1 is a diagram of a solder paste distribution system which is suitable for use by the invention.

FIG. 1 shows a solder paste distribution system 20 which is suitable for use by the invention. The solder paste distribution system 20 places portions of solder paste on a mounting location 22 of a circuit board 24 as part of a circuit board manufacturing process. The solder paste distribution system 20 includes a base 26, a tool holder 28, and a solder paste distribution tool 30. As illustrated in FIG. 1, the solder paste distribution tool 30 defines a solder paste aperture 32 having a non-circular cross-sectional shape. Further details of the solder paste distribution system 20 will now be provided with reference to FIGS. 2A and 2B.

Figure 2A:
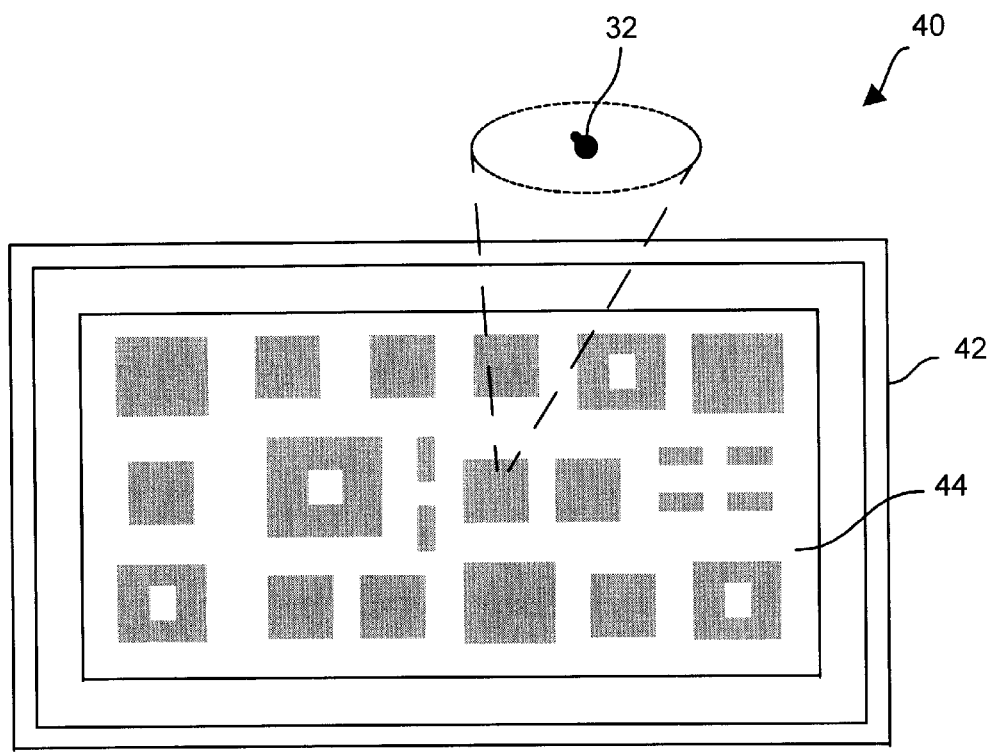
FIG. 2A is a top view of a solder paste distribution tool of the solder paste distribution system of FIG. 1.

FIG. 2A shows a top view of a solder paste distribution tool 40 which is suitable for use as the solder paste distribution tool 30 of FIG. 1. As shown, the solder paste distribution tool 40 includes a support member 42 and a stencil 44. The support member 42 is frame-shaped in order to provide structural support to the stencil 44. By way of example only, the stencil 44 defines solder paste apertures for distributing solder paste to mounting locations for an entire circuit board. At least one of the solder paste apertures has a non-circular cross-sectional shape.

Figure 2B:
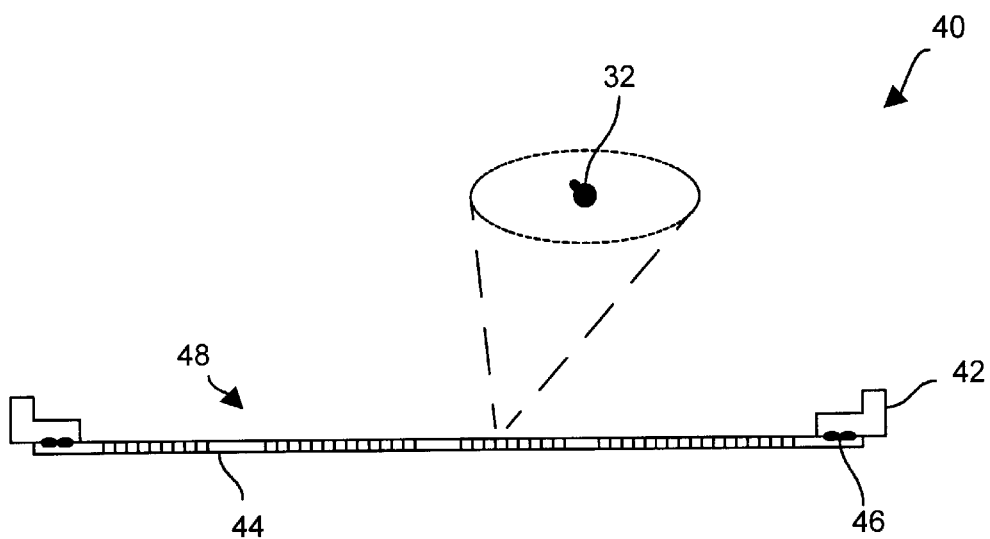
FIG. 2B is a cross-sectional side view of the solder paste distribution tool of the solder paste distribution system of FIG. 1.

FIG. 2B shows a cross-sectional side view of the solder paste distribution tool 40. As shown, the support member 42 surrounds the periphery of the stencil 44 to provide structural support. A fastener 46 fastens the stencil 44 to the support member 42. In one arrangement, the fastener 46 is a glue-like material (e.g., epoxy) which couples the stencil 44 to the support member 42. In another arrangement, the fastener 46 includes hardware such as rivets or screws which couple the stencil 44 to the support member 42. Other fastening mechanisms are suitable as well (e.g., tape, welds, friction fits between formed slots in the support member 42, etc.).

As shown in FIG. 2B, the support member 42 frames the stencil 44 and provides a cavity 48 for containing solder paste. Accordingly, a spreader (e.g., a squeegee that is controlled manually by an operator, or in an automated manner by machinery) can move across the top of the stencil 44 within the cavity 48 to push solder paste through the solder paste apertures of the stencil 44. The high edges of the support member 42 reduce the likelihood of accidental spillage of solder paste from the solder paste distribution tool 40. Further details of the stencil 44 will now be provided with reference to FIGS. 3A and 3B.

Figure 3A:
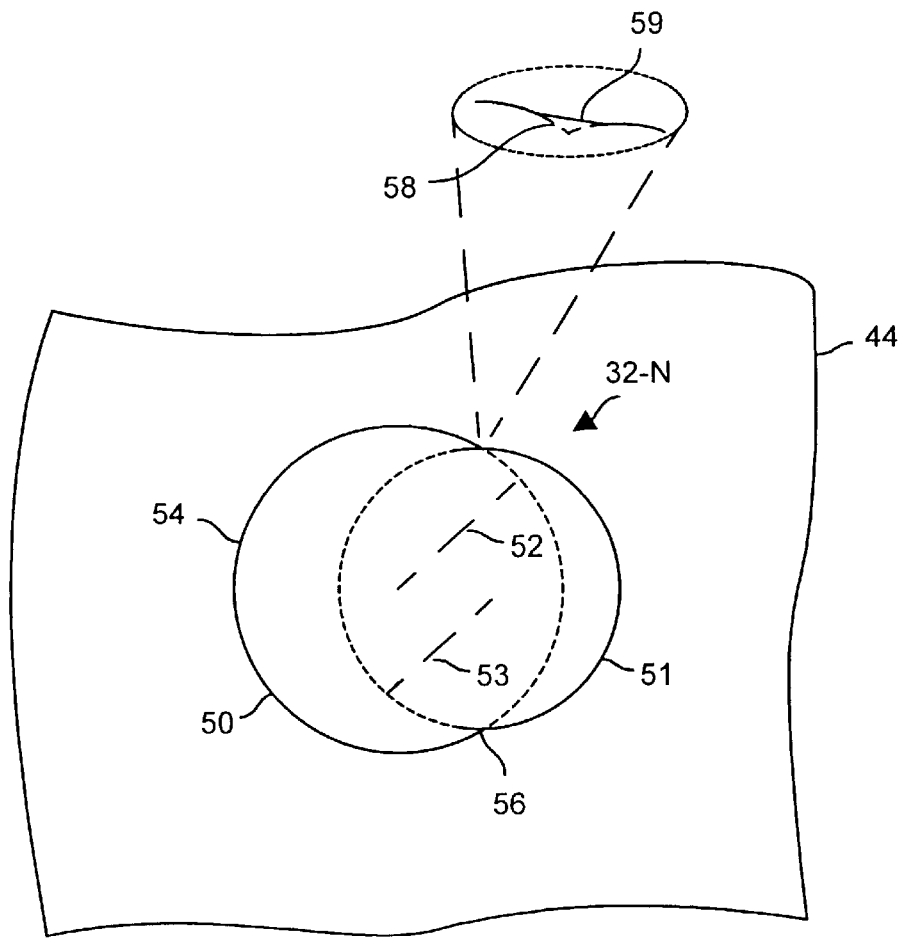
FIG. 3A is a detailed top view of a solder paste aperture of the solder paste distribution tool of FIGS. 2A and 2B.

FIG. 3A shows a close-up view of a solder paste aperture 32-N of the stencil 44. The solder paste aperture 32-N has a non-circular cross-sectional shape that includes partially coinciding circles 50, 51. In one arrangement, the partially coinciding circles 50, 51 provide a profile that approximates a keyhole in shape. The circle 50 has a diameter 52 which is larger than a diameter 53 of the circle 51. When the stencil 44 is properly aligned with a circuit board (e.g., see the circuit board 24 in the system 20 of FIG. 1), an outer surface 54 of the non-circular cross-sectional aperture 32-N preferably coincides with a circuit board pad and a stringer that leads to the circuit board pad. In some arrangements, the stencil 44 includes multiple solder paste apertures 32.

It should be understood that the portion 56 of the outer surface 54 where the circles 50, 51 intersect is preferably not a sharp edge 58 (see FIG. 3A). Rather, the portion 56 preferably blends smoothly to form a blended radius 59 due to characteristics of a masking and etching process used to form apertures in the stencil 44. The blended radius 59 provides a larger-sized aperture to reduce the likelihood of solder paste clogging when the stencil 44 is used to distribute solder paste.

Figure 3B:
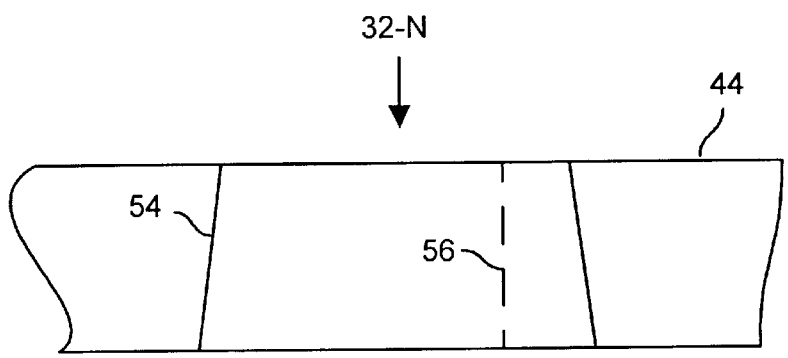
FIG. 3B is a detailed cross-sectional side view of the solder paste aperture of the solder paste distribution tool of FIGS. 2A and 2B.

FIG. 3B shows a cross-sectorial side view of the stencil 44. As shown in FIG. 3B, the outer surface 54 of the non-circular cross-sectional aperture 32-N is preferably not perpendicular with the surface of the stencil 44. Rather, the outer surface 54 tapers slightly such that the aperture 32-N is smaller at the top opening which receives solder paste, and larger at the bottom opening where the solder paste exits onto the pad and portion of the adjoining stringer. Further details of how the solder paste distribution system 20 operates will now be provided with reference to FIGS. 4A and 4B.

Figure 4A:
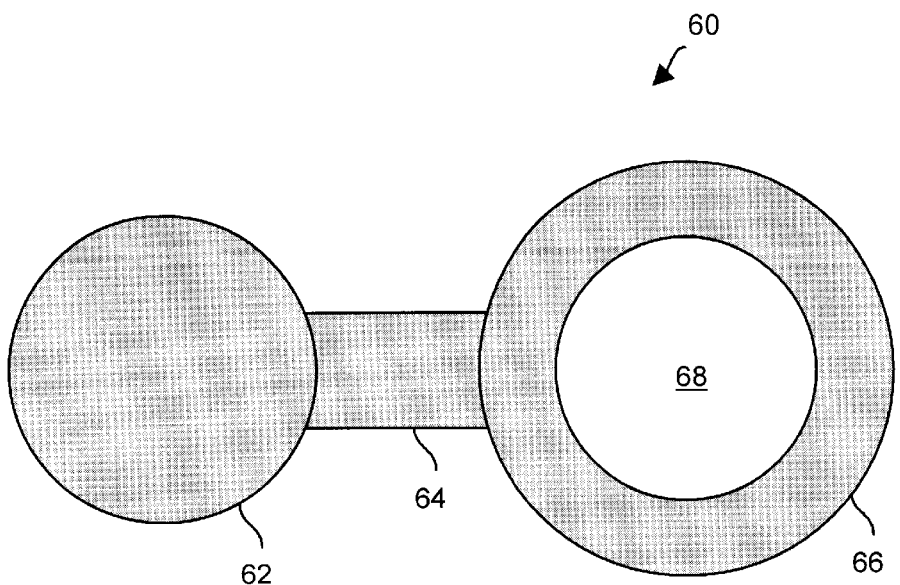
FIG. 4A is a top view of a soldering pad, a stringer and a via on a circuit board, which are suitable for use by the solder paste distribution system of FIG. 1.

FIG. 4A shows a top view of a connection layout 60 of a mounting location 22 of the circuit board 24 of FIG. 1. The connection layout 60 (sometimes referred to as a "dog-bone" configuration due to its shape) includes a pad 62 (e.g., copper), a stringer 64 and a via 66, i.e., a plated through hole 68 in the circuit board 24. The stringer 64 is capable of carrying an electrical signal between the pad 62 and the via 66.

Figure 4B:
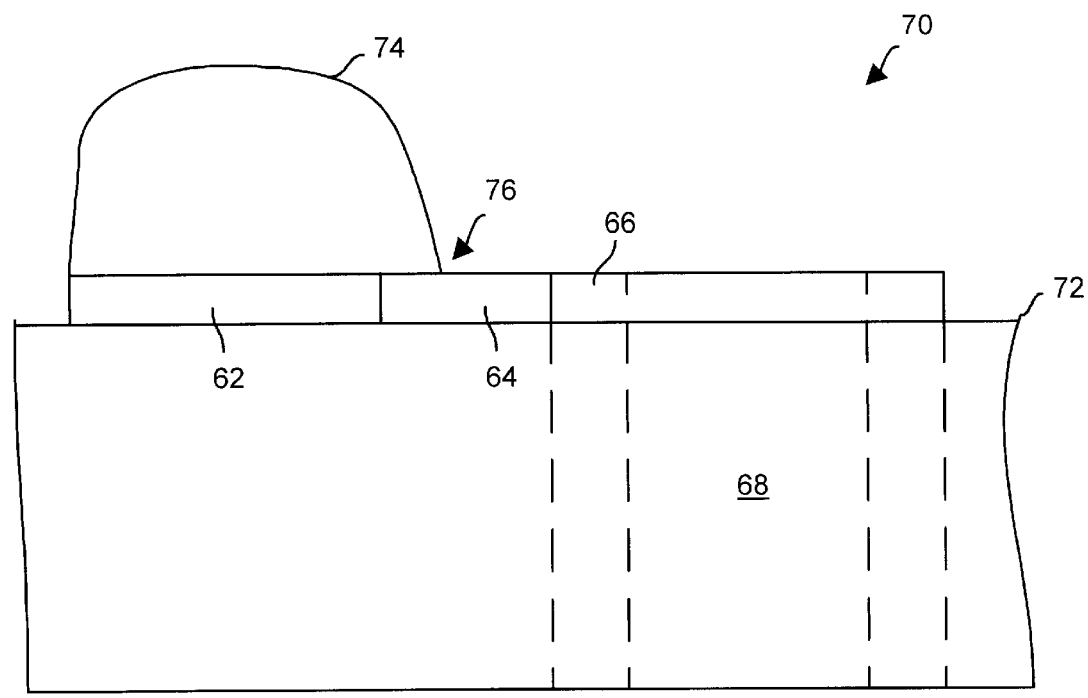
FIG. 4B is a detailed cross-sectional side view of the soldering pad, the stringer and the via on the circuit board of FIG. 4A.

FIG. 4B shows a cross-sectional side view of a portion 70 of the circuit board 24 having the connection layout 60 of FIG. 4A. The portion 70 includes the pad 62, the stringer 64 and circuit board material 72 (e.g., fiberglass). FIG. 4B further shows a portion 74 of solder paste deposited by through the non-circular cross-sectional shaped aperture 32 of the solder paste distribution tool 30. A part 76 of the solder paste portion 74 contacts and resides over a portion of the stringer 64. Preferably, there is no overprinting performed so that edges of the solder paste portion 74 roughly mirror the edges of the pad 62 (except in extreme tolerance situations). Further details of the operation of the solder paste distribution system 20 will now be provided with reference to FIGS. 5 and 6.

Figure 5:
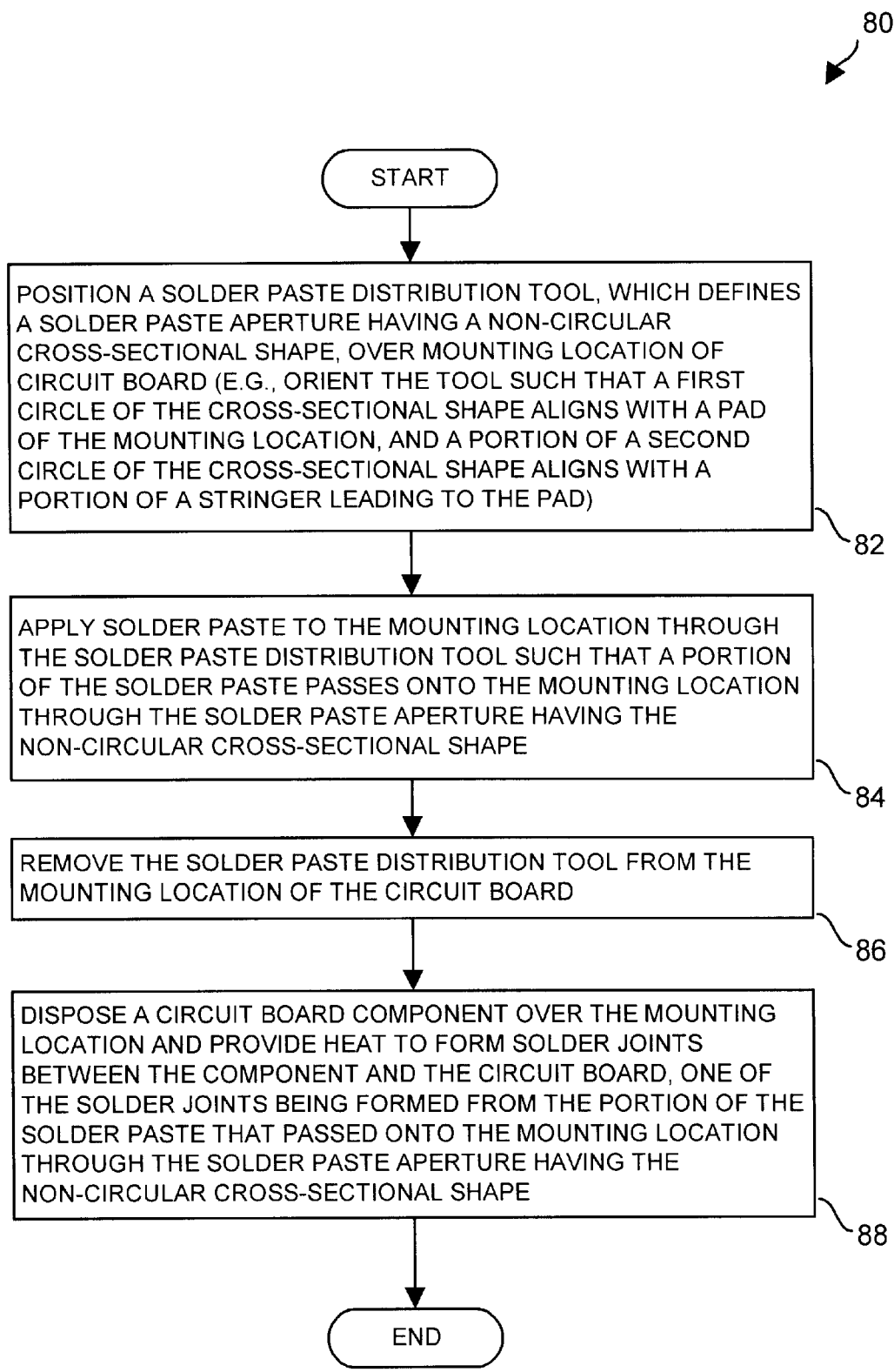
FIG. 5 is a flow diagram of a procedure for mounting a circuit board component to a circuit board using the solder paste distribution system of FIG. 1.

FIG. 5 shows a procedure 80 which is performed by a user of the solder paste distribution system 20 of FIG. 1. In step 82, the user positions the solder paste distribution tool 30, which defines the solder paste aperture 32 having the non-circular cross-sectional shape, over a mounting location 22 of the circuit board 24. Preferably, the user orients the tool 30 such that a first circle (e.g., see the circle 50 of FIG. 3A) aligns with a pad of the mounting location 22 (e.g., see the pad 62 of FIG. 4A), and such that a second circle (e.g., see the circle 51 of FIG. 3A) aligns with a portion of a stringer of the mounting location 22 (e.g., see the stringer 64 of FIG. 4A).

In step 84, the user applies solder paste to the mounting location 22 through the solder paste distribution tool 30 such that a portion of the solder paste passes onto the mounting location 22 through the solder paste aperture 32 having the non-circular cross-sectional shape. In one arrangement, the user manually squeegees solder paste through apertures (including the solder paste aperture 32 having the non-circular cross-sectional shape) of the solder paste distribution tool 30. In another arrangement, the user operates automated equipment (e.g., under computer control) which squeegees solder paste through the apertures. The solder paste aperture 32, which is generally larger than conventional solder paste apertures that do not implement overprinting, tends to pack with solder paste better and release the solder paste better than conventional apertures.

In step 86, the user removes the solder paste distribution tool 30 from the mounting location 22 of the circuit board 24. Preferably, solder paste distribution tool 30 remains in contact with the circuit board as the user distributes the solder paste, and removal of the solder paste distribution tool 30 from the circuit board shears the solder paste such that the solder paste portions substantially retain the shapes of the solder paste apertures defined by the solder paste distribution tool 30. In one arrangement, the user simply moves the tool holder 28 such that the solder paste distribution tool 30 is no longer positioned over the circuit board 24, and the circuit board manufacturing process continues at the system 20. In other arrangements, the user transfers the circuit board 24 from the solder paste distribution system 20 to one or more other assembly stations for component placement and soldering (e.g., processing through wave soldering equipment).

In step 88, the user disposes a circuit board component (e.g., an IC, a portion of circuit board material having components, etc.) over the mounting location 22, and provides heat to form solder joints between the component and the circuit board. One of the solder joints is formed from the portion of solder paste that passed onto the mounting location 22 through the solder paste aperture having the non-circular cross-sectional shape. Here, as the solder paste liquefies, solder is drawn back to the region between the pad and the component contact due to surface tension in the main mass of solder between the pad and the component contact. Accordingly, the solder forms a robust and healthy solder joint between the pad and corresponding component contact (e.g., BGA ball).

It should be understood that the direction of migration of the solder initially over the stringer is in a direction that is opposite that of conventional approaches that do not intentionally distribute solder on a portion of the stringer. In such conventional approaches, the solder migrates towards the exposed stringer (e.g., due to the solder's affinity for exposed metal) and possibly other circuit board structures (e.g., the via, other pads and stringers, etc.). Accordingly, the conventional approaches have an increased likelihood of forming a poor solder joint or no solder joint between the pad and the component contact due to solder volume reduction. In contrast, the invention prevents solder migration away from the pad making it less likely that solder will be drawn into a via to reduce the volume of solder for the solder joint, and less likely that the solder will form an unintended short (e.g., via-to-via short, pad-to-pad short, etc.).

It should be further understood that the placement of solder paste over the pad and a portion of the stringer alleviates the need for overprinting, which is typically performed to compensate for a reduction in solder paste volume during the soldering process. With the invention, some solder in the solder paste over the stringer moves back to the region between the circuit board pad and the component contact (due to surface tension fluid dynamics) thus compensating for the volume reduction in the solder paste over the pad. With overprinting unnecessary and alleviated, there is less placement of solder paste over circuit board portions which are non-metallic, and less likelihood of solder migration in unintended directions.

Figure 6:
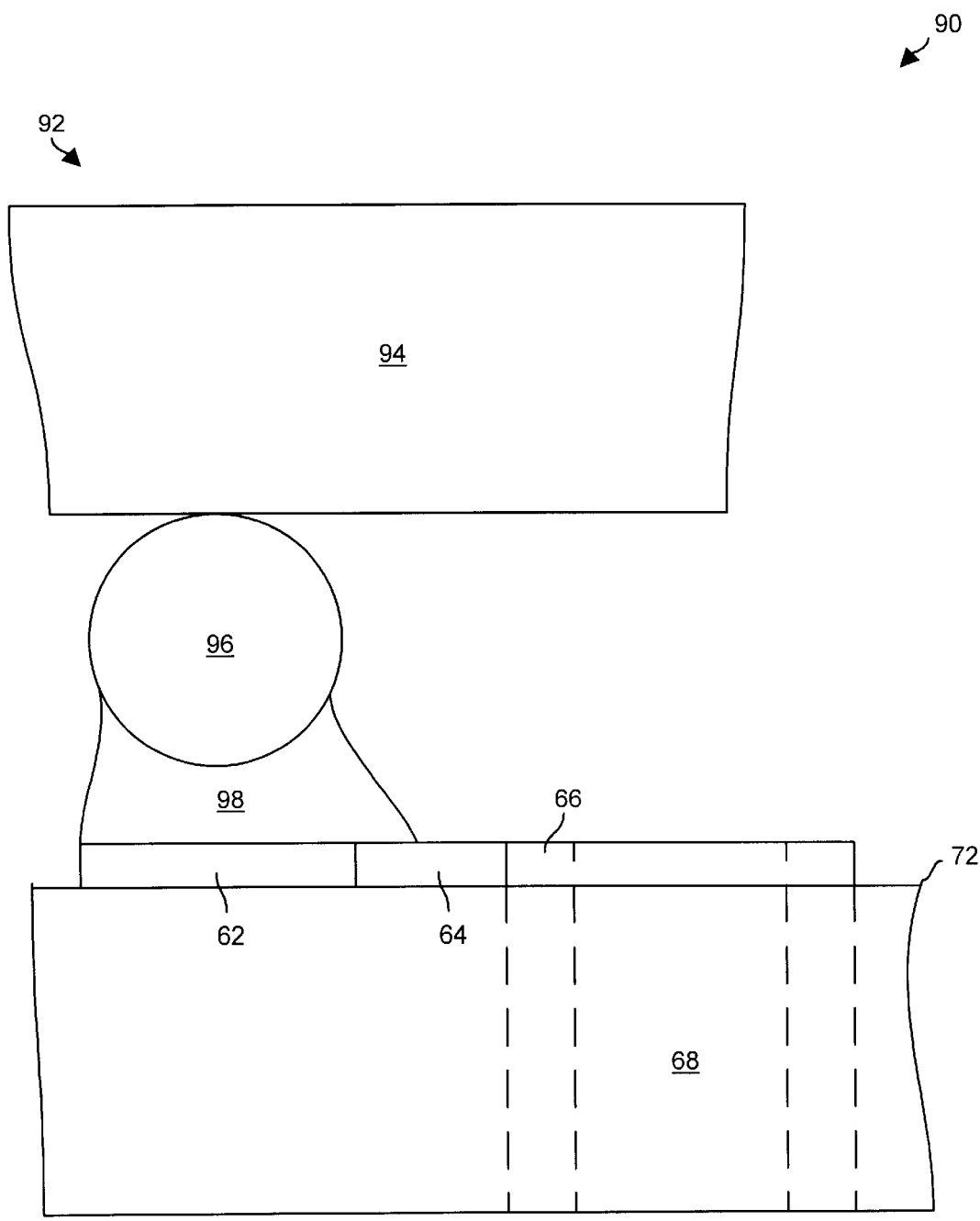
FIG. 6 is a detailed cross-sectional side view of the soldering pad, the stringer and the via on the circuit board of FIG. 4A when a circuit board component is soldered to the circuit board.

FIG. 6 shows a cross-sectional side view 90 of a circuit board portion 92 soldered to the circuit board portion 70 of FIG. 4B. By way of example only, the circuit board portion 92 is a portion of a BGA module having a package 94 and ball-shaped leads 96. As shown in FIG. 6, the ball-shaped lead 96 corresponding to the pad 62 is robustly soldered to the pad 62 and a portion of the stringer 64. The resulting solder joint includes solder 98 from the portion 74 of solder paste originally deposited by the solder paste distribution system 20 (see FIG. 4B). In particular, part of the solder paste portion 74 that was originally wetted to the stringer (see part 76 in FIG. 4B remains wetted to the stringer 64, while some of that part joins the solder paste between the pad 62 and the contact 96 (due to surface tension fluid dynamics) to compensate for the reduction in volume of the solder paste. Further details of the solder paste distribution tool 30 will now be provided with reference to FIG. 7.

Figure 7:
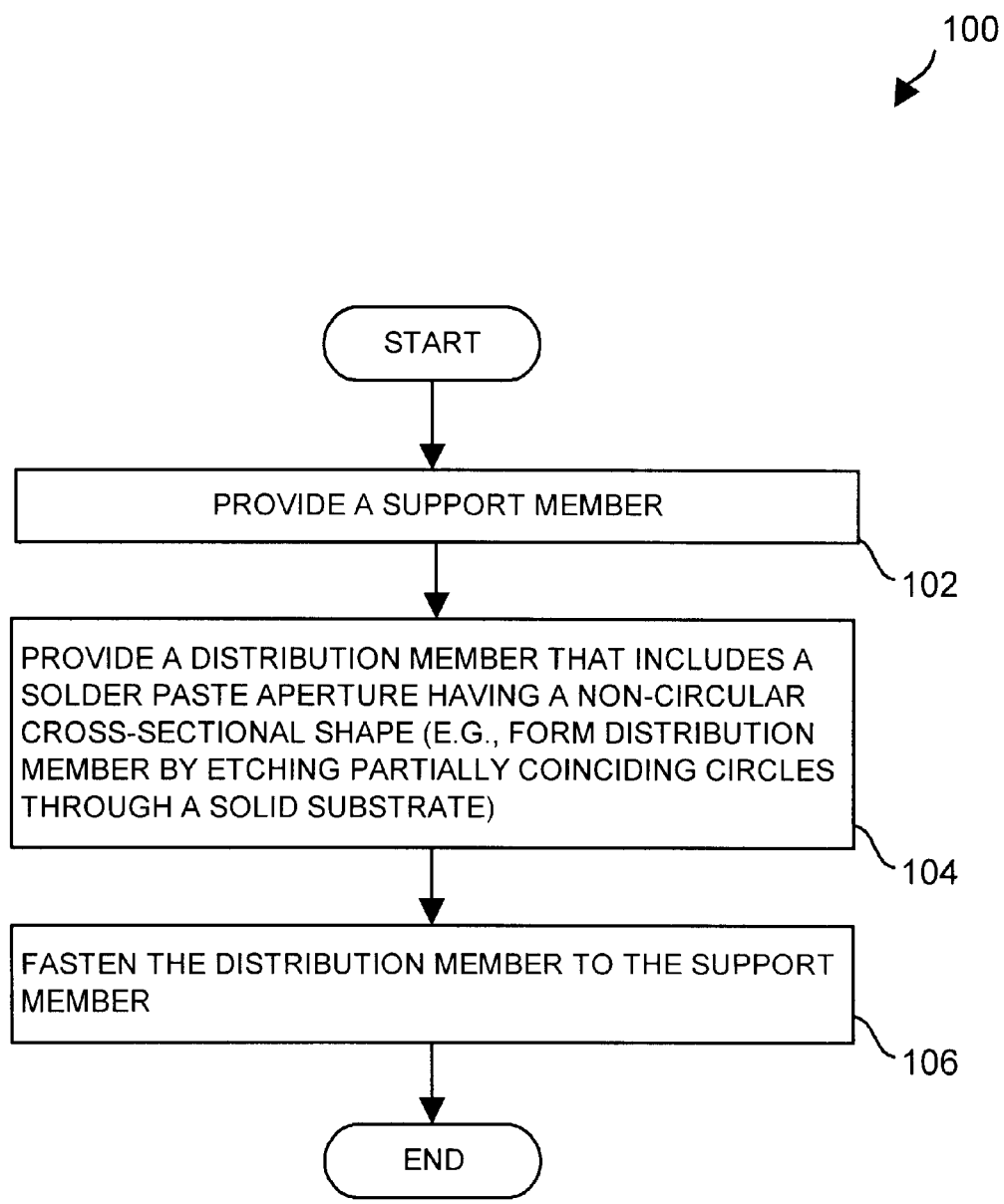
FIG. 7 is a flow diagram of a procedure for making the solder paste distribution tool of FIGS. 2A and 2B.

FIG. 7 shows a procedure 100 for making the solder paste distribution tool 30. In step 102, a tool manufacturer provides a support member (e.g., see support member 42 in FIGS. 2A and 2B).

In step 104, the manufacturer provides a distribution member (e.g., a stencil) that includes a solder paste aperture having a non-circular cross-sectional shape (e.g., see stencil 44 in FIGS. 2A and 2B). In one arrangement, the distribution member is formed by masking and etching partially coinciding circles (e.g., see circles 50, 51 of FIG. 3A) through a solid substrate (e.g., a metal plate).

In step 106, the manufacturer fastens the distribution member to the support member. In one arrangement, the manufacturer bonds (e.g., using epoxy) the distribution member to the support member. In other arrangements, the manufactures couples the distribution member to the support member using hardware (e.g., rivets, screws, etc.).

Figure 8A:
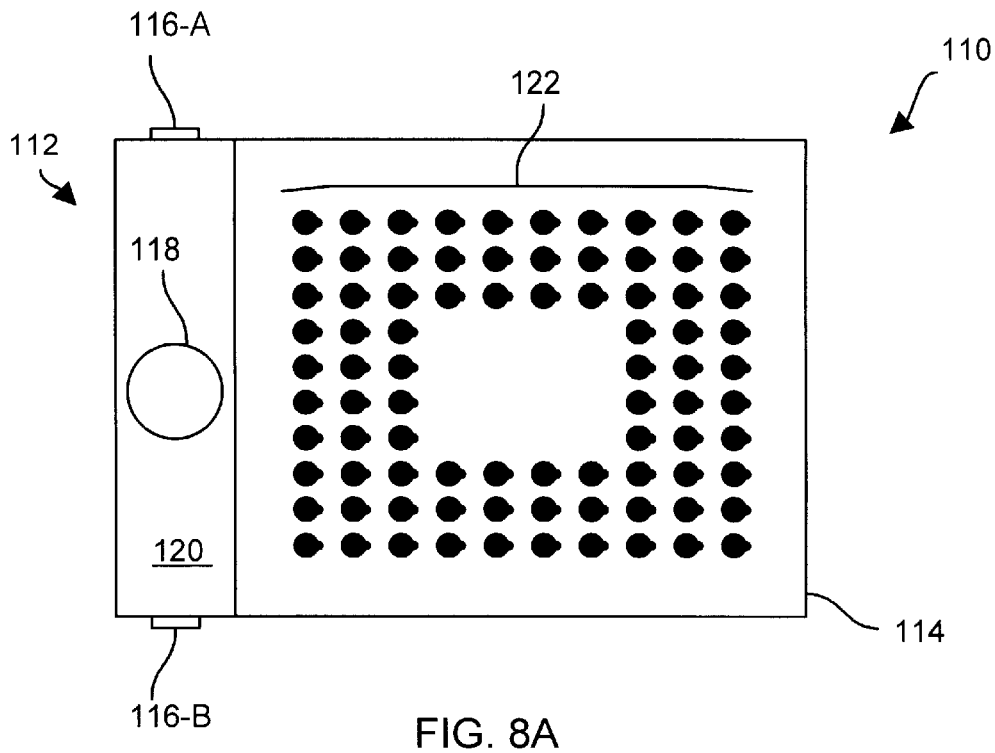
FIG. 8A is a top view of an alternative solder paste distribution tool which is suitable for use by the solder paste distribution system of FIG. 1.
Figure 8B:
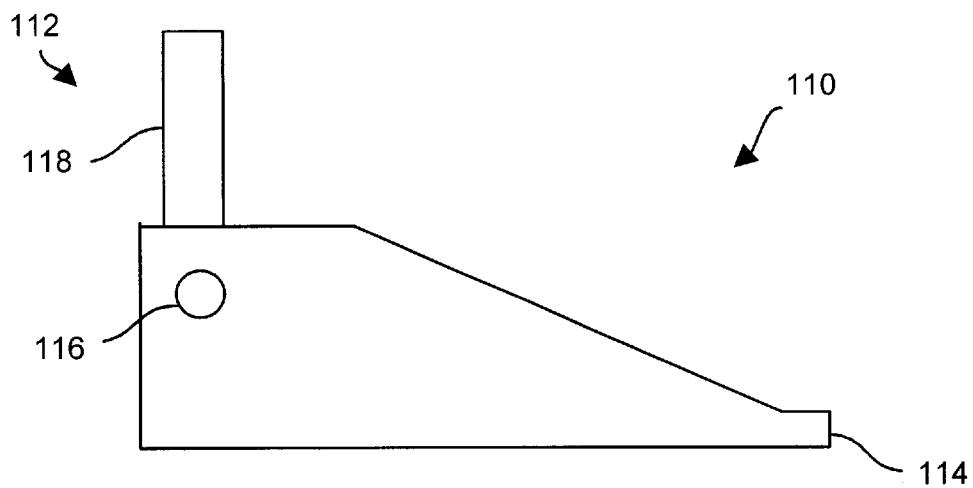
FIG. 8B is a cross-sectional side view of the alternative solder paste distribution tool of FIG. 8A.

FIGS. 8A and 8B show a solder paste distribution tool 110 which is suitable for use by the invention. The solder paste distribution tool 110 is suitable for distributing solder paste for a single mounting location 22 rather than multiple mounting locations such as the solder paste distribution tool 40 of FIGS. 2A and 2B which distribution solder paste for an entire circuit-board. The solder paste distribution tool 110 includes a support member 112, a distribution member 114 (e.g., a stencil) and fasteners 116-A, 116-B. The support member 112 includes a handle 118 and a block 120. The handle 118 securely couples to the block 120. In turn, the fasteners 116-A, 116-B fasten the distribution member 114 to the block 120.

The distribution member 120 defines, by way of example only, multiple solder paste apertures 122 having non-circular cross-sectional shapes. As shown in FIG. 8A, each aperture 122 is oriented in the same direction.

The solder paste distribution tool 110 is suitable for use in the solder paste distribution system 20 of FIG. 1. Alternatively, the solder paste distribution tool 110 can be used without the base 26 and the tool holder 28. That is, the solder paste distribution tool 110 simply can be positioned and held in place over a mounting location 22, e.g., by adhesive tape (e.g., kapton tape) over an edge of the tool 110 (see step 82 in FIG. 5). Solder paste can then be distributed through the apertures 122 of the tool 110 onto the mounting location 22 (step 84 in FIG. 5). A user then removes the tool 110 and solders a component to the mounting location 22 (steps 86 and 88 of FIG. 5). In one arrangement, the user can remove the tool 110 simply by pivoting the tool 110 about a taped edge in order to neatly shear the portions of solder paste. The user can solder the component to the mounting location using circuit board rework equipment (e.g., holding a nozzle that applies heated gas over the component and the mounting location).

Figure 9A:
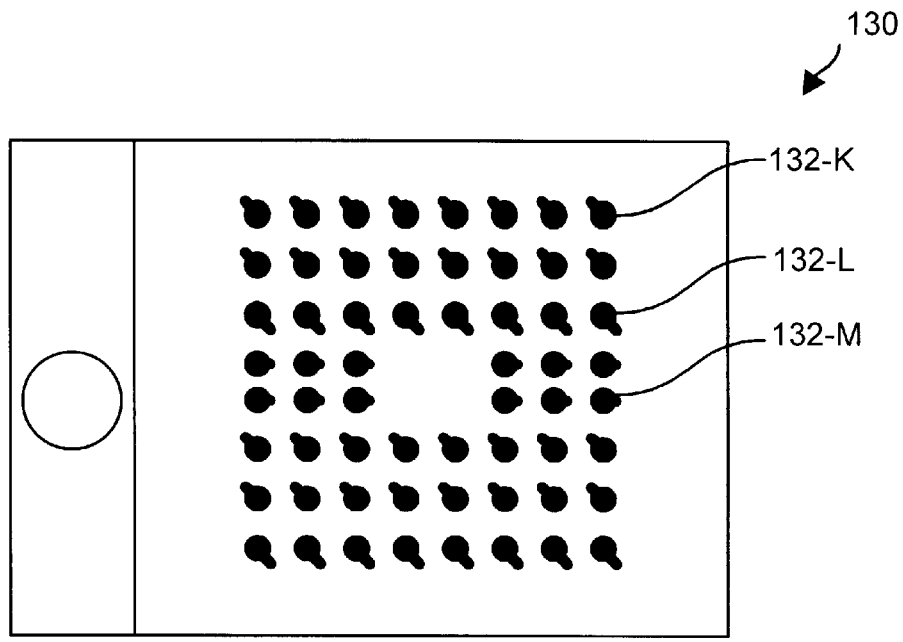
FIG. 9A is a top view of a solder paste distribution tool having multiple apertures oriented in different directions.

It should be understood that the apertures of the solder paste distribution tools 30, 40 and 110 need not define the same type of aperture homogeneously. FIG. 9A shows, by way of example only, a solder paste distribution tool 130 which is similar to the solder paste distribution tool 110 of FIGS. 8A and 8B except that the solder paste distribution tool 130 defines apertures having different orientations. For example, the tool 130 defines sets of apertures 132-K, 132-L and 132-M, each of which have orientations in different directions. Accordingly, the solder paste distribution tool 130 is suitable for distributing solder paste on a circuit board having pads with stringers that extend in such different directions from their pads.

Figure 9B:
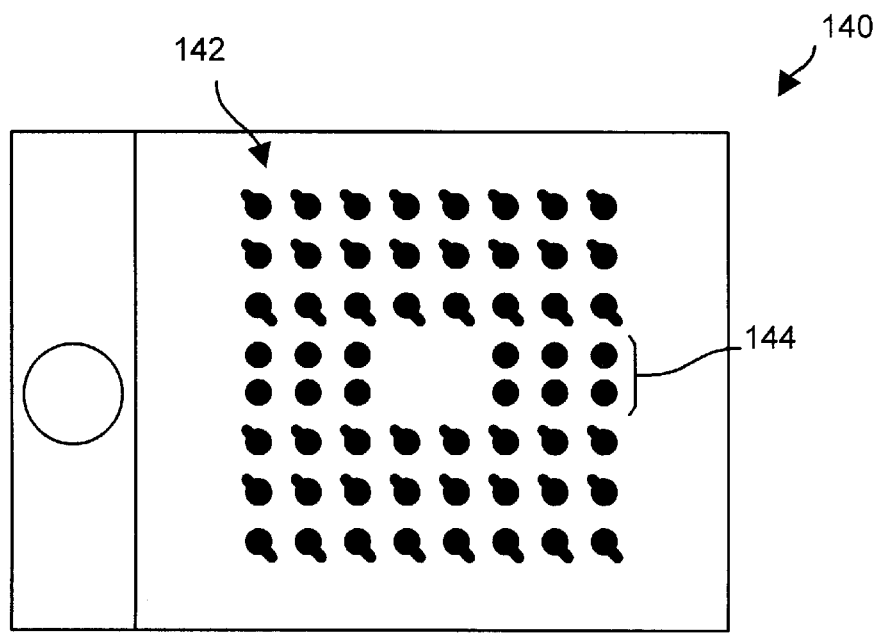
FIG. 9B is a top view of a solder paste distribution tool having multiple apertures with non-circular cross-sectional shapes, and other apertures with circular cross-sectional shapes.

Furthermore, it should be understood that there is no requirement that each solder paste aperture have a non-circular cross-sectional shape. FIG. 9B shows, by way of example only, a solder paste distribution tool 140 that defines a set of apertures 142 having non-circular cross-sectional shapes, and a set of apertures 144 that have circular cross-sectional shapes.

As described above, the invention is directed to techniques for distributing older paste using a tool that defines a solder paste aperture having a non-circular cross-sectional shape. When the non-circular shape coincides with a pad and at least a portion of a stringer leading to the pad in a circuit board manufacturing process, solder paste is deposited over the pad and the stringer portion. Since solder paste now resides on the stringer portion, solder is not drawn from the pad toward the stringer portion during the soldering process as with some conventional situations. Rather, solder within the solder paste that resides on the stringer portion tends to adhere to the stringer portion, while some of the solder volume over the stringer pulls back to join the solder over the pad due to surface tension of the solder. The end result is a robust solder joint between the pad and corresponding component contact. Additionally, the non-circular shape of the aperture allows for apertures that are larger in size than apertures for stencils that do not implement conventional overprinting approaches thus reducing the likelihood of clogging. The features of the invention may be particularly useful in circuit board manufacturing systems, methods and apparatus such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the solder paste distribution tools 30, 40 and 110 were described as mirroring circuit board pads in order to place solder paste portions on the pads and portions of stringers leading to the pads. The techniques of the invention can be used to distribute solder on other structures as well such as vias, specially shaped contacts, etc.

Additionally, it should be understood that the solder paste distribution tools 30, 40 and 110 were described as being capable of distributing solder paste on circular-shaped pads and stringer portions. The tools 30, 40 and 110 can be used to distribute solder paste on non-circular shaped pads (e.g., hexagon shaped pads) and stringer portions as well.

Furthermore, the solder paste distribution system 20 was shown as including a large flat plate as the base 26 onto which the circuit board 24 can reside, and a multi-portioned arm as the tool holder 28, by way of example only. Other configurations are suitable for use by the invention as well. For example, the base 26 need not be flat and support the circuit board 24. Rather, the base 26 can different in size and shape (e.g., a clamp that fastens to a table). Similarly, the tool holder 28 can be different in size and shape (e.g., pivoting or swiveling members, a single portioned arm, etc.).

Additionally, it should be understood that the techniques of the invention are suitable for use by various types of pad geometry. For example, in connection with BGAs, the invention is suitable for use with copper-defined techniques (characteristic of BGAs with 1.27 mm pitch), i.e., where the insulating laminate does not intentionally cover the pads of the circuit board mounting locations, but instead extend around the peripheries of the pads with gaps between the pads and laminate. The invention is also suitable for use with solder-mask defined techniques in which the insulating laminate covers the edges of the pads (characteristic of BGAs with 0.8 mm pitch). Moreover, the invention is suitable for various BGA technologies including processes in which the BGA balls (i.e., the BGA module contacts) melt, and other processes in which the BGA balls do not melt. The invention is particularly suitable for 1.0 mm pitch geometry which is essentially middle ground between copper-defined and solder-mask defined applications.

Furthermore, it should be understood that the apertures having the non-circular cross-sectional shapes need not be formed by partially coinciding circles. Rather, the apertures can have other shapes that are non-circular (e.g., squares, rectangles, hexagons, etc.). Since the distribution member (stencil) can be etched from a mask, the mask can simply be made to include such non-circular apertures, which will then be created during the etching process. Such modifications are intended to be within the scope of the invention.

What is claimed is:

1. A solder paste distribution tool, comprising:
a support member for attaching to a tool holder;
a distribution member that defines a solder paste aperture having a non-circular cross-sectional shape; and
a fastener that secures the distribution member to the support member, wherein the non-circular cross-sectional shape of the solder paste aperture includes partially coinciding circles having different diameters.

2. The solder paste distribution tool of claim 1 wherein the partially coinciding circles include:
a first circle having a first diameter; and
a second circle having a second diameter that is less than the first diameter, the second circle being disposed relative to the first circle such that when the first circle aligns over a soldering pad of a circuit board, at least a portion of the second circle aligns over at least a portion of a stringer leading to the soldering pad.

3. A solder paste distribution tool, comprising:
a support member for attaching to a tool holder;
a distribution member that defines a solder paste aperture having
(i) a non-circular cross-sectional shape, (ii) a top opening at a top surface of the distribution member, and (iii) a bottom opening at a bottom surface of the distribution member; and
a fastener that secures the distribution member to the support member, wherein the distribution member defines multiple solder paste apertures which include the solder paste aperture having the non-circular cross-sectional shape.

4. A solder paste distribution tool, comprising:
a support member for attaching to a tool holder;
a distribution member that defines multiple solder paste apertures including a solder paste aperture having a non-circular cross-sectional shape; and
a fastener that secures the distribution member to the support member, wherein the cross-sectional shape of each of the multiple solder paste apertures includes a first circle having a first diameter and a second circle having a second diameter that is different than the first diameter, the second circle partially coinciding with the first circle; and wherein, for each of the multiple solder paste apertures, the second circle of that non-circular solder paste aperture resides in a same direction relative to the first circle of that solder paste aperture.

5. A solder paste distribution tool, comprising:
a support member for attaching to a tool holder;
a distribution member that defines multiple solder paste apertures including a solder paste aperture having a non-circular cross-sectional shape; and
a fastener that secures the distribution member to the support member, wherein the cross-sectional shape of each of the multiple solder paste apertures includes a first circle having a first diameter and a second circle having a second diameter that is different than the first diameter, the second circle partially coinciding with the first circle; wherein, for a first solder paste aperture, the second circle of the first solder paste aperture resides in a first direction relative to the first circle of the first solder paste aperture; and wherein, for a second solder paste aperture, the second circle of the second solder paste aperture resides in a second direction relative to the first circle of the second solder paste aperture, the second direction being different than the first direction.

6. A solder paste distribution system, comprising:
a base;
a tool holder coupled to the base; and
a solder paste distribution tool, coupled to the tool holder, the solder paste distribution tool including:
a support member that couples to the tool holder,
a distribution member that defines a solder paste aperture having (i) a non-circular cross-sectional shape, (ii) a top opening at a top surface of the distribution member, and (iii) a bottom opening at a bottom surface of the distribution member, and
a fastener that secures the distribution member to the support member.

7. A solder paste distribution system, comprising:
a base;
a tool holder coupled to the base; and
a solder paste distribution tool, coupled to the tool holder, the solder paste distribution tool including:
a support member that couples to the tool holder,
a distribution member that defines a solder paste aperture having a non-circular cross-sectional shape, and
a fastener that secures the distribution member to the support member, wherein the non-circular cross-sectional shape of the solder paste aperture includes partially coinciding circles having different diameters.

8. The solder paste distribution system of claim 7 wherein the partially coinciding circles include:
a first circle having a first diameter; and
a second circle having a second diameter that is less than the first diameter, the second circle being disposed relative to the first circle such that when the first circle aligns over a soldering pad of a circuit board, at least a portion of the second circle aligns over at least a portion of a stringer leading to the soldering pad.

9. The solder paste distribution system of claim 6 wherein the distribution member of the solder paste distribution tool defines multiple solder paste apertures which include the solder paste aperture having the non-circular cross-sectional shape.

10. A solder paste distribution system, comprising:
a base;
a tool holder coupled to the base; and
a solder paste distribution tool, coupled to the tool holder, the solder paste distribution tool including:
a support member that couples to the tool holder,
a distribution member that defines multiple solder paste apertures including a solder paste aperture having a non-circular cross-sectional shape; and
a fastener that secures the distribution member to the support member, wherein the cross-sectional shape of each of the multiple solder paste apertures includes a first circle having a first diameter and a second circle having a second diameter that is different than the first diameter, the second circle partially coinciding with the first circle; and wherein, for each of the multiple solder paste apertures, the second circle of that solder paste aperture resides in a same direction relative to the first circle of that solder paste aperture.

11. A solder paste distribution system, comprising:
a base;
a tool holder coupled to the base; and a solder paste distribution tool, coupled to the tool holder, the solder paste distribution tool including:
  a support member that couples to the tool holder,
  a distribution member that defines multiple solder paste apertures including a solder paste aperture having a non-circular cross-sectional shape; and
  a fastener that secures the distribution member to the support member, wherein cross-sectional shape of each of the multiple solder paste apertures includes a first circle having a first diameter and a second circle having a second diameter that is different than the first diameter, the second circle partially coinciding with the first circle; wherein, for a first solder paste aperture, the second circle of the first solder paste aperture resides in a first direction relative to the first circle of the first solder paste aperture; and wherein, for a second solder paste aperture, the second circle of the second solder paste aperture resides in a second direction relative to the first circle of the second solder paste aperture, the second direction being different than the first direction.

12. A solder paste distribution tool, comprising:
a support member for attaching to a tool holder;
a distribution member that defines a solder paste aperture having
  (i) a non-circular cross-sectional shape, (ii) a top opening at a top surface of the distribution member, and (iii) a bottom opening at a bottom surface of the distribution member; and
a fastener that secures the distribution member to the support member, wherein the distribution member further defines an aperture surface of the solder paste aperture such that the aperture surface is non-perpendicular with the top and bottom surfaces of the distribution member.

13. The solder paste distribution system of claim 6 wherein the distribution member of the solder paste distribution tool further defines an aperture surface of the solder paste aperture such that the aperture surface is non-perpendicular with the top and bottom surfaces of the distribution member.

* * * * *